United States Patent
Yin et al.

(10) Patent No.: US 10,134,765 B2
(45) Date of Patent: Nov. 20, 2018

(54) OXIDE SEMICONDUCTOR TFT ARRAY SUBSTRATE AND METHOD FOR MANUFACTURING THE SAME

(71) Applicants: BOE Technology Group Co., Ltd., Beijing (CN); Hefei Xinsheng Optoelectronics Technology Co., Ltd., Hefei (CN)

(72) Inventors: Bingkun Yin, Beijing (CN); Junhao Han, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/170,433

(22) Filed: Jun. 1, 2016

(65) Prior Publication Data
US 2016/0358944 A1   Dec. 8, 2016

(30) Foreign Application Priority Data
Jun. 3, 2015   (CN) .......................... 2015 1 0300713

(51) Int. Cl.
*H01L 29/10*   (2006.01)
*H01L 27/12*   (2006.01)
*H01L 29/66*   (2006.01)
*H01L 29/786*   (2006.01)
(Continued)

(52) U.S. Cl.
CPC .... *H01L 27/1225* (2013.01); *H01L 21/02554* (2013.01); *H01L 27/127* (2013.01); *H01L 27/1262* (2013.01); *H01L 27/1288* (2013.01); *H01L 29/66969* (2013.01); *H01L 29/7869* (2013.01); *G02F 2001/136236* (2013.01);
(Continued)

(58) Field of Classification Search
CPC ........... H01L 21/02554; H01L 27/1225; H01L 27/1288; H01L 29/7869; H01L 29/66765; H01L 29/78669; H01L 29/78678; G02F 2001/136236
See application file for complete search history.

(56) References Cited

U.S. PATENT DOCUMENTS

2004/0222421 A1* 11/2004 Lee ....................... G02F 1/1362
                                                              257/66
2008/0176364 A1   7/2008 Yang et al.
(Continued)

FOREIGN PATENT DOCUMENTS

CN    101656232    *  2/2010   ............ H01L 21/84
CN    101656232  A    2/2010
CN    102651343  A    8/2012

OTHER PUBLICATIONS

Jun. 27, 2017—(CN) First Office Action Appn 201510300713.4 with English Tran.

*Primary Examiner* — Jesse Y Miyoshi
(74) *Attorney, Agent, or Firm* — Banner & Witcoff, Ltd.

(57) ABSTRACT

A method for manufacturing an oxide semiconductor TFT array substrate is provided, which including: successively depositing an oxide semiconductor active layer and a transparent conductive layer on a base substrate without breaking vacuum; and forming patterns of an active layer and a transparent conductive layer. An oxide semiconductor TFT array substrate is further provided.

4 Claims, 8 Drawing Sheets

(51) Int. Cl.
*H01L 21/02* (2006.01)
*G02F 1/1362* (2006.01)
(52) U.S. Cl.
CPC .. *H01L 29/66765* (2013.01); *H01L 29/78669* (2013.01); *H01L 29/78678* (2013.01)

(56) References Cited

U.S. PATENT DOCUMENTS

2009/0160741 A1* 6/2009 Inoue .................... G09G 3/3233
345/76
2009/0236597 A1* 9/2009 Ye ....................... H01L 29/7869
257/43

* cited by examiner

OXIDE SEMICONDUCTOR TFT ARRAY SUBSTRATE AND METHOD FOR MANUFACTURING THE SAME

This application claims priority to and the benefit of Chinese Patent Application No. 201510300713.4 filed on Jun. 3, 2015, which application is incorporated herein in its entirety.

TECHNICAL FIELD

Embodiments of the present disclosure relate to an oxide semiconductor array substrate and a method for manufacturing the same.

BACKGROUND

Thin film transistor is an important component in a liquid crystal display device. Currently, in the TFT techniques, active layers are most made of amorphous silicon (α-Si) or polysilicon (p-Si). With development of display technology, demands on display panel of a greater size and high resolution are continuously increasing. α-Si is limitative to be applied in display panels with great size, high resolution and fast response speed, due to its low mobility value (0.5~0.8 $cm^2/v*s$). Even though polysilicon has a high mobility value (>10 $cm^2/v*s$), processes for manufacturing a display panel with polysilicon is very complicated and processes for manufacturing a display panel with great size has not been well developed, application of polysilicon is also limited in display panels with great size and high resolution. Comparatively, oxide semiconductor has a promising perspective in manufacturing display panels with great size and high resolution due to its high mobility value (>10 $cm^2/v*s$) and its applicability in manufacturing display panels with great size.

In conventional processes for manufacturing oxide semiconductor TFT array substrate, because of limitation on processes and selected materials, an oxide semiconductor layer is prone to be exposed to ambient environment and its electrical conductivity will be degraded. Contact resistance between the oxide semiconductor layer and source/drain electrodes is relatively high, which requires high driving voltages for the display device and consumes more energy, and robustness of the formed TFT is degraded simultaneously.

SUMMARY

At least one embodiment of the present disclosure provides a method for manufacturing an oxide semiconductor array substrate, comprising: successively depositing an oxide semiconductor material layer and a transparent conductive material layer without breaking vacuum; and forming patterns of an oxide semiconductor active layer and a transparent conductive layer through one patterning process.

At least one embodiment according to the disclosure provides an oxide semiconductor array substrate manufactured by the method provided by the technical solution as described above. The oxide semiconductor TFT array substrate comprises a base substrate, an oxide semiconductor active layer and a transparent conductive layer configured to form a pixel electrode, wherein the oxide semiconductor active layer and the transparent conductive layer are formed respectively from an oxide semiconductor material layer and an transparent conductive material layer which are successively deposited without breaking vacuum.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

REFERENCE SIGNS 101, base substrate; 102, gate electrode; 103, gate insulation layer; 104, oxide semiconductor active layer; 105, transparent conductive layer; 106, source/drain metal layer; 107, photoresist layer.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
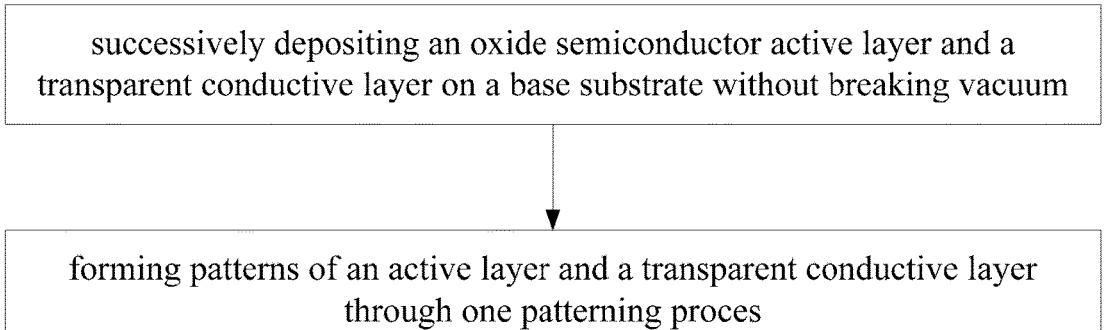
FIG. 1 is a schematic view of a method for manufacturing an oxide semiconductor TFT array substrate according to an embodiment of the present disclosure.

As illustrated in FIG. 1, a method for manufacturing an oxide semiconductor TFT array substrate according to an embodiment of the present disclosure comprises: successively depositing an oxide semiconductor material layer and a transparent conductive material layer without breaking vacuum; and forming patterns of an oxide semiconductor active layer and a transparent layer.

Herein, "without breaking vacuum" means that the vacuum environments for depositing the oxide semiconductor material layer and the transparent conductive material layer are continuous, and the vacuum environments are proximately maintained between the operations of depositing the oxide semiconductor material layer and depositing the transparent conductive material layer.

During manufacturing an oxide semiconductor TFT array substrate by the method mentioned above, the oxide semiconductor material layer and the transparent conductive material layer are formed successively without breaking vacuum, and the oxide semiconductor material layer is protected by the transparent conductive material layer that is deposited later and avoided from being exposed to environment in subsequent processes, so as to prevent the robustness of the TFTs from being degraded due to exposure to external environment for long time. Further, the on-state current characteristics of the oxide semiconductor active layer in operation is improved and in turn the driving voltage and power consumption of a display device thus manufactured are decreased, and thereby the robustness of the array substrate is enhanced.

The TFT(s) in the oxide semiconductor TFT array substrate manufactured by the method as described above can be of a top gate type or a bottom gate type, and the embodiments of the present disclosure are not limited to the types of the TFT.

Figure 2:
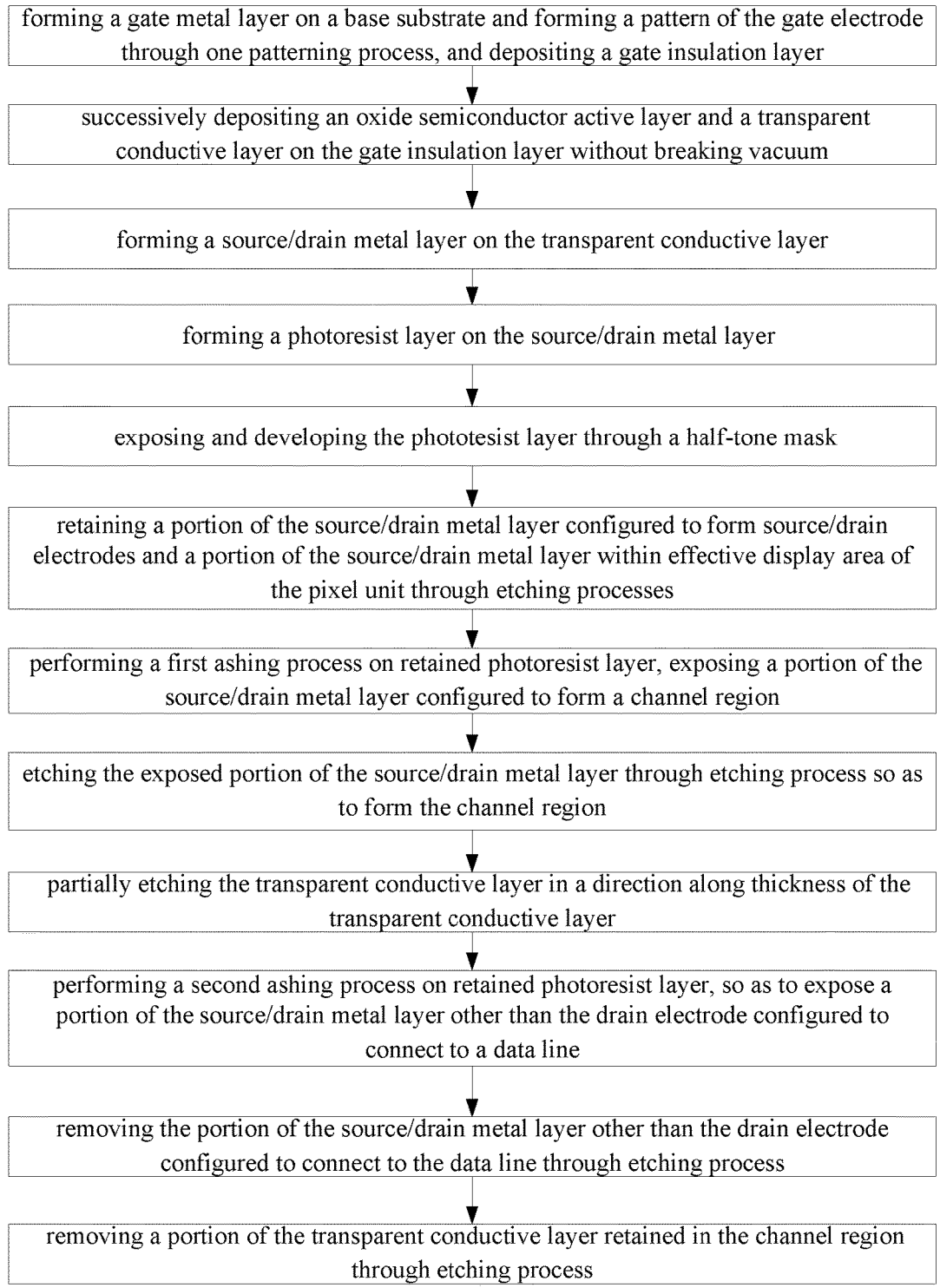
FIG. 2 is a flow chart of a method for manufacturing an oxide semiconductor TFT array substrate according to an embodiment of the present disclosure.
Figure 2A:
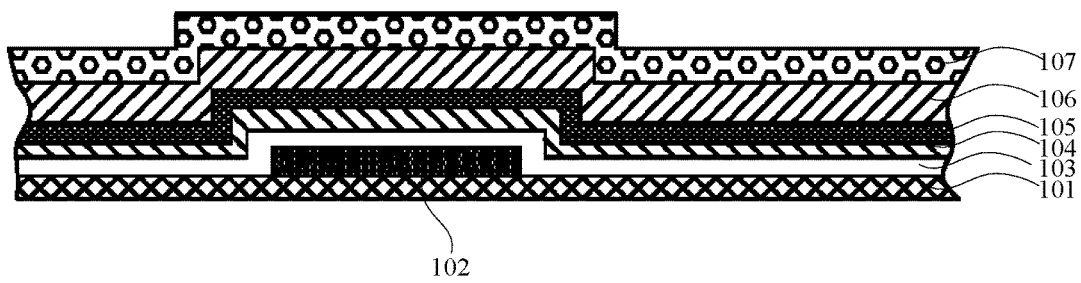
FIG. 2a is a schematic sectional view of a structure formed by depositing a gate insulation layer, an oxide semiconductor material layer, a transparent conductive material layer, source/drain metal layer after forming a pattern of gate electrode.
Figure 2B:
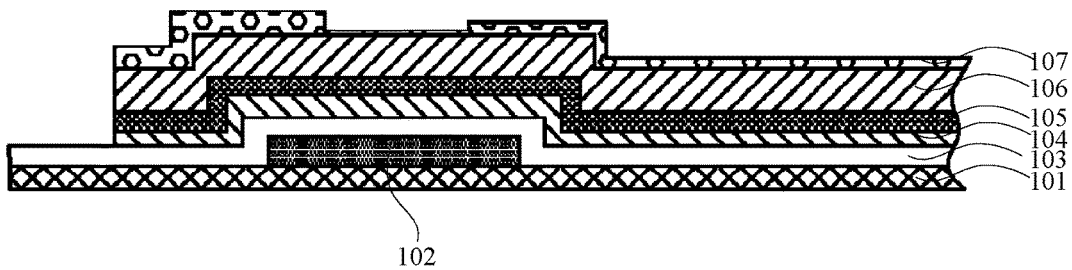
FIG. 2b is a schematic sectional view of a structure formed by retaining a portion of the source/drain metal layer for forming source/drain electrodes and a portion of the source/drain metal layer within an effective display area of pixel unit through an etching process.
Figure 2C:
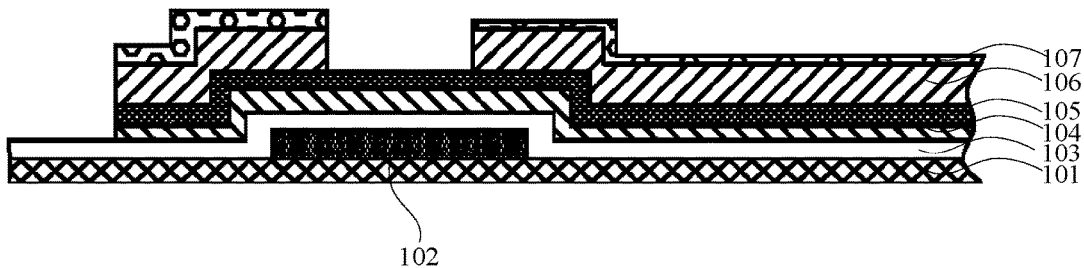
FIG. 2c is a schematic sectional view of a structure formed by etching a portion of the source/drain metal layer within a channel region to be formed through an etching process.
Figure 2D:
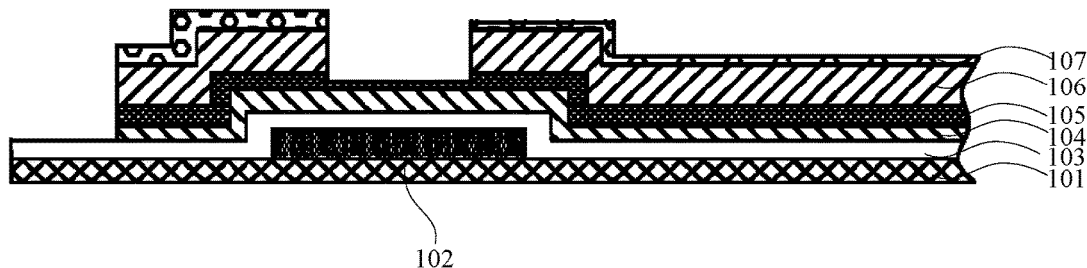
FIG. 2d is a schematic sectional view of a structure formed by partially etching the transparent conductive material layer within the channel region in a direction along the thickness of the transparent conductive material layer.
Figure 2E:
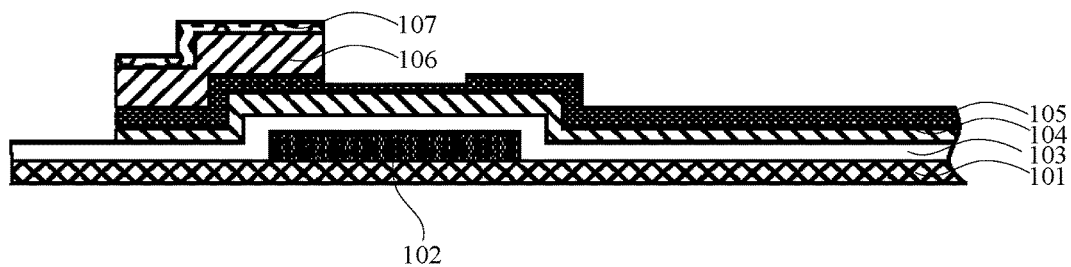
FIG. 2e is a schematic sectional view of a structure formed by removing a portion of the source/drain electrode metal layer other than a portion connecting a data line and a drain electrode through an etching process.
Figure 2F:
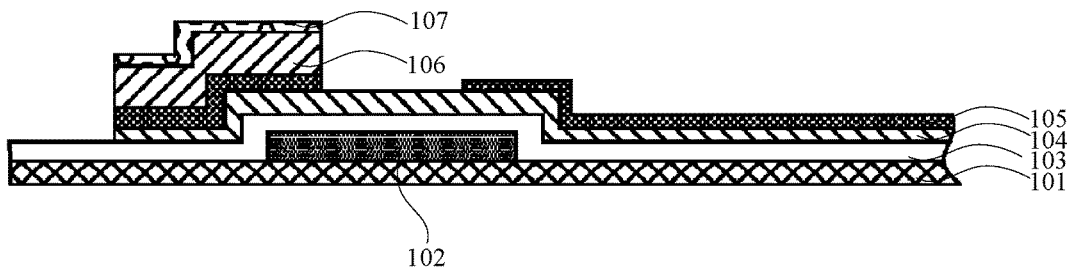
FIG. 2f is a schematic sectional view of a structure formed by removing the residual portion of the transparent conductive material layer within the channel region through an etching process.

In one embodiment according to the present disclosure, where TFTs in the oxide semiconductor TFT array substrate are of top gate type, as illustrated in FIG. 2, the example of the method can comprise the following operations:

forming a gate metal layer on a base substrate 101 and forming a pattern of the gate electrode 102 through one patterning process, and then depositing a gate insulation layer 103;

successively depositing an oxide semiconductor material layer 104 and a transparent conductive material layer 105 on the gate insulation layer without breaking vacuum;

forming a source/drain metal layer 106 on the transparent conductive layer 105;

forming a photoresist layer 107 on the source/drain metal layer 106, wherein a schematic sectional view of formed structure is as illustrated in FIG. 2a;

exposing and developing the phototesist layer 107 through a half-tone mask for example;

retaining a portion of the source/drain metal layer configured to form source/drain electrodes and a portion of the source/drain metal layer within an effective display area of a pixel unit, while removing other portions of the source/drain metal layer, through an etching processes, wherein the resultant structure is as illustrated in FIG. 2b;

performing an ashing process on the photoresist layer 107 retained after exposing and developing, exposing a portion of the source/drain metal layer 106 within a channel region to be formed;

etching the exposed portion of the source/drain metal layer 106 through an etching process so as to form the channel region, wherein the resultant structure is as illustrated in FIG. 2c;

partially etching the transparent conductive material layer 105 in a direction along a thickness of the transparent conductive material layer 105, wherein the resultant structure is as illustrated in FIG. 2d;

performing a second ashing process on the retained photoresist layer 107, so as to expose a portion of the source/drain metal layer 106 other than the drain electrode configured to connect to a data line;

removing the portion of the source/drain metal layer 106 other than the drain electrode configured to connect to the data line through an etching process, wherein the resultant structure is as illustrated in FIG. 2e; and removing a portion of the transparent conductive material layer 105 retained in the channel region through an etching process, wherein the resultant structure is as illustrated in FIG. 2f.

In the above embodiment of the present disclosure, when preparing the oxide semiconductor TFT array substrate, as the oxide semiconductor material layer 104 and the transparent conductive material layer 105 are successively deposited without breaking vacuum, and the portion of the transparent conductive material layer 105 within the channel region is removed through two etching processes, thus it is avoided that robustness of the formed display device is degraded due to exposure of the oxide semiconductor material layer to external environment for long time. Thereby on-state current of the oxide semiconductor active layer is increased and the driving voltage and power consumption of display device are lowered, and further stability of the display device is improved.

In the embodiment according to the present disclosure as described above, as the pixel electrode is made of a transparent conductive material layer and is in direct contact with the oxide semiconductor material layer, the contact resistance between the oxide semiconductor active layer and the pixel electrode can be decreased, and thus the on-state current of the oxide semiconductor active layer is increased in turn. Further, the driving voltage and power consumption of a display device utilizing the array substrate thus formed are decreased while the stability of the display device is improved.

In one embodiment of the present disclosure, a portion of the transparent conductive material layer within the display area of the pixel unit has a shape of comb, and at the same time of removing a portion of the transparent conductive material layer 105 retained in the channel region through an etching process in manufacturing, the portion of the transparent conductive material layer within the display area of the pixel unit are formed to have a shape of comb as well.

Figure 3:
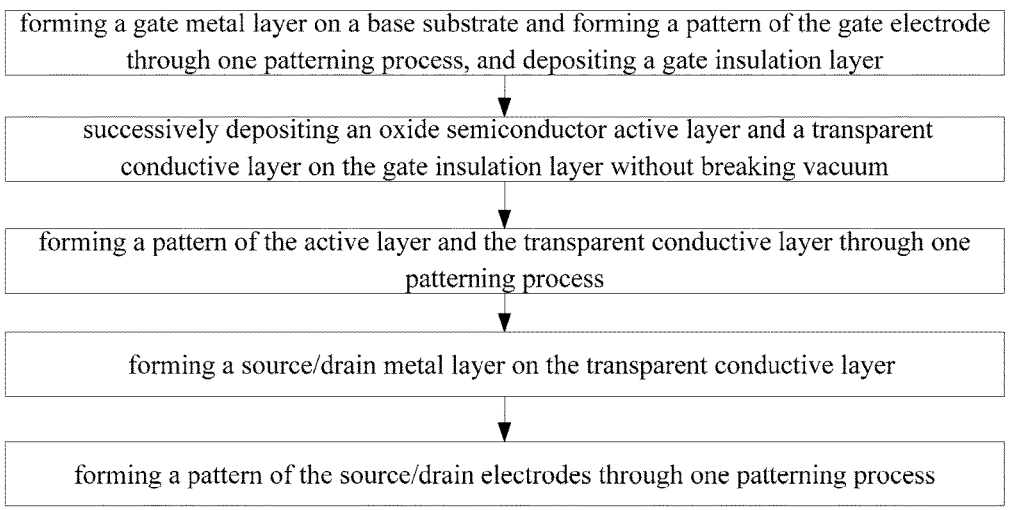
FIG. 3 is a flow chart of a method for manufacturing an oxide semiconductor TFT array substrate according to another embodiment of the present disclosure.
Figure 3A:
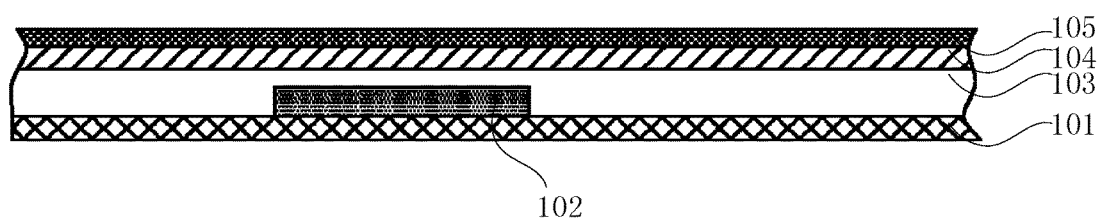
FIG. 3a is a schematic sectional view of a structure formed by depositing a gate insulation layer, an oxide semiconductor material layer, a transparent conductive material layer after forming a pattern of gate electrode.
Figure 3B:
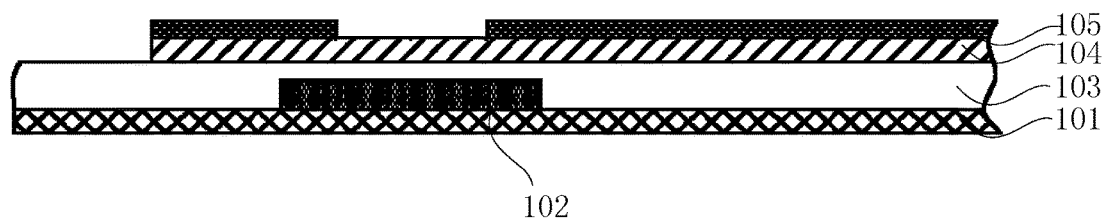
FIG. 3b is a schematic sectional view of a structure formed after forming patterns of an oxide semiconductor active layer and of a transparent conductive layer.
Figure 3C:
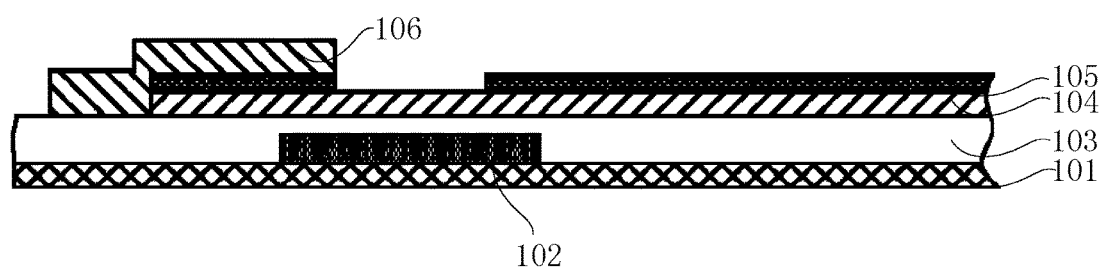
FIG. 3c is a schematic sectional view of a structure formed after forming a source/drain metal layer on the transparent conductive layer and forming patterns of source/drain electrodes through one patterning process.

According to another embodiment of the present disclosure, as illustrated in FIG. 3, an example of the method for manufacturing an oxide semiconductor TFT array substrate can comprise:

forming a gate metal layer on a base substrate 101 and forming a pattern of gate electrode 102 through one patterning process, and then depositing a gate insulation layer 103;

successively depositing an oxide semiconductor material layer 104 and a transparent conductive material layer 105 without breaking vacuum, wherein the schematic sectional view of resultant structure of the array substrate is as illustrated in FIG. 3a;

forming patterns of the oxide semiconductor active layer 104 and the transparent conductive layer 105 through one patterning process, wherein the schematic sectional view of resultant structure is as illustrated in FIG. 3b;

forming a source/drain metal layer 106 on the transparent conductive layer 105; and forming a pattern of source/drain electrode through one patterning process, wherein the schematic sectional view of the resultant array substrate is as illustrated in FIG. 3c;

When manufacturing an oxide semiconductor TFT array substrate through the method as described above, the oxide semiconductor material layer 104 and the transparent conductive material layer 105 can be also deposited successively without breaking vacuum. Thus, it is avoided that robustness of device is degraded due to exposure of the oxide semiconductor material layer to external environment for a long time during the manufacturing. Further, the transparent conductive layer is in direct contact with the oxide semiconductor active layer, and contact resistance therebetween is decreased, thereby the on-state current of the oxide semiconductor active layer is enhanced and the driving voltage and power consumption of display device are lowered, and device stability is improved as a result.

In one embodiment of the present disclosure, the finally obtained patterns of the source/drain electrodes comprise only a pattern of the drain electrode and a pattern configured to connect to a data line, and the portion of the transparent conductive material layer in contact with the oxide semiconductor active layer is in direct electrical contact with the portion of the transparent conductive material layer within the effective display area of the pixel unit. In the array substrate manufactured by the method, the pixel electrode is made of the transparent conductive material layer, and is in direct contact with the oxide semiconductor active layer. Thus, the contact resistance between the oxide semiconductor active layer and the pixel electrode are decreased and the on-state current of the oxide semiconductor active layer is increased as a result. Further, as compared with a conventional array substrate, the opaque metal layer in the source/drain electrode region are saved/removed and therefore the aperture ratio of the pixel unit is increased, thereby the luminance of a display panel utilizing the array substrate is enhanced, and the driving voltage and power consumption of a display device utilizing the array substrate are reduced and the stability of the devices is improved.

In one embodiment of the present disclosure, the pattern of the transparent conductive layer in the display area of the pixel unit has a shape of comb. When forming patterns of the oxide semiconductor active layer 104 and the transparent conductive layer 105 through one patterning process, the formed pattern of the transparent conductive layer comprises a pattern of the transparent conductive layer in the display area of the pixel unit and having a shape of comb.

Figure 4:
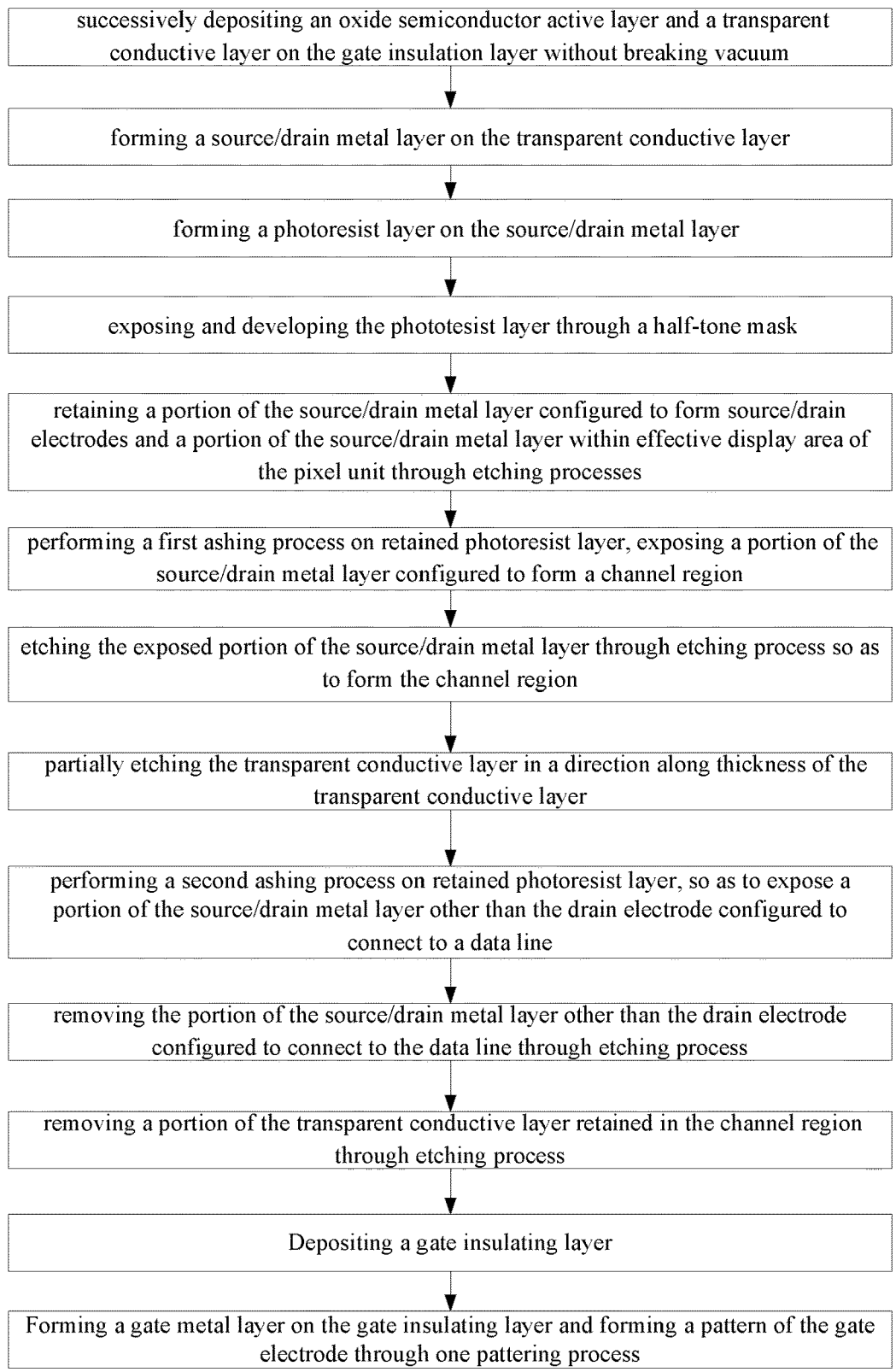
FIG. 4 is a flow chart of a method for manufacturing an oxide semiconductor TFT array substrate according to yet another embodiment of the present disclosure.

In another embodiment of the present disclosure, TFTs in the oxide semiconductor TFT array substrate are of a top gate type, as illustrated in FIG. 4, the method can comprise the following operations:

successively depositing an oxide semiconductor material layer and a transparent conductive material layer;

forming a source/drain metal layer on the transparent conductive material layer;

forming a photoresist layer on the source/drain metal layer;

exposing the photoresist layer with a half-tone mask for example and developing;

removing portions of the source/drain metal layer other than a portion of the source/drain metal layer configured to form source/drain electrodes and a portion of the source/drain metal layer within an effective display area of a pixel unit through an etching process;

performing a first ashing process on the retained photoresist layer after developing so as to expose a portion of the source/drain metal layer in a channel region to be formed;

etching the exposed portion of the source/drain metal layer in the channel region to be formed through an etching process so as to form the channel region;

partially etching a portion of the transparent conductive material layer within the channel region in a direction along a thickness of the transparent conductive material layer;

performing a second ashing process on the retained photoresist layer so as to expose a portion of the transparent conductive material layer other than a portion of the transparent conductive material layer for the drain electrode connected with a data line;

removing the portion of the transparent conductive material layer other than the portion of the transparent conductive material layer for the drain electrode connected with the data line through an etching process;

removing a portion of the transparent conductive material layer retained in the channel region through an etching process;

depositing a gate insulation layer; and forming a gate metal layer on the gate insulation layer and forming pattern of gate electrode through an etching process.

When manufacturing an oxide semiconductor TFT array substrate by the method according the embodiment of the present disclosure as described above, as the oxide semiconductor material layer and the transparent conductive material layer are successively deposited without breaking vacuum and a portion of the transparent conductive material layer within the channel region is removed through two etching process, it is avoided that device robustness is degraded due to exposure of the oxide semiconductor material layer to external environment for a long time during manufacturing. Thus, the on-state current of the oxide semiconductor active layer is increased and therefore the driving voltage and power consumption of a display device utilizing the array substrate are decreased, thereby improving the device stability.

In the array substrate manufactured by the method as described above, the pixel electrode is made of the transparent conductive material layer and is in direct contact with the oxide semiconductor active layer, thus the contact resistance between the oxide semiconductor active layer and the pixel electrode is reduced and the on-state current of the oxide semiconductor active layer is increased. Further, compared with a conventional TFT array substrate, an opaque metal layer in the source/drain electrode region are saved/removed and the aperture ratio of the pixel unit are increased, and thus the luminance of a display panel utilizing such an array substrate is enhanced. Thereby, the driving voltage and power consumption of a display device utilizing the display panel are decreased, and the robustness of the devices are improved.

In one embodiment of the present disclosure, the pattern of the transparent conductive layer in the display area of the pixel unit has a shape of comb. When removing a portion of the transparent conductive material layer retained in the channel region through an etching process, a portion of the transparent conductive material layer within the display area of the pixel unit is formed to have a structure of comb as well for example.

Figure 5:
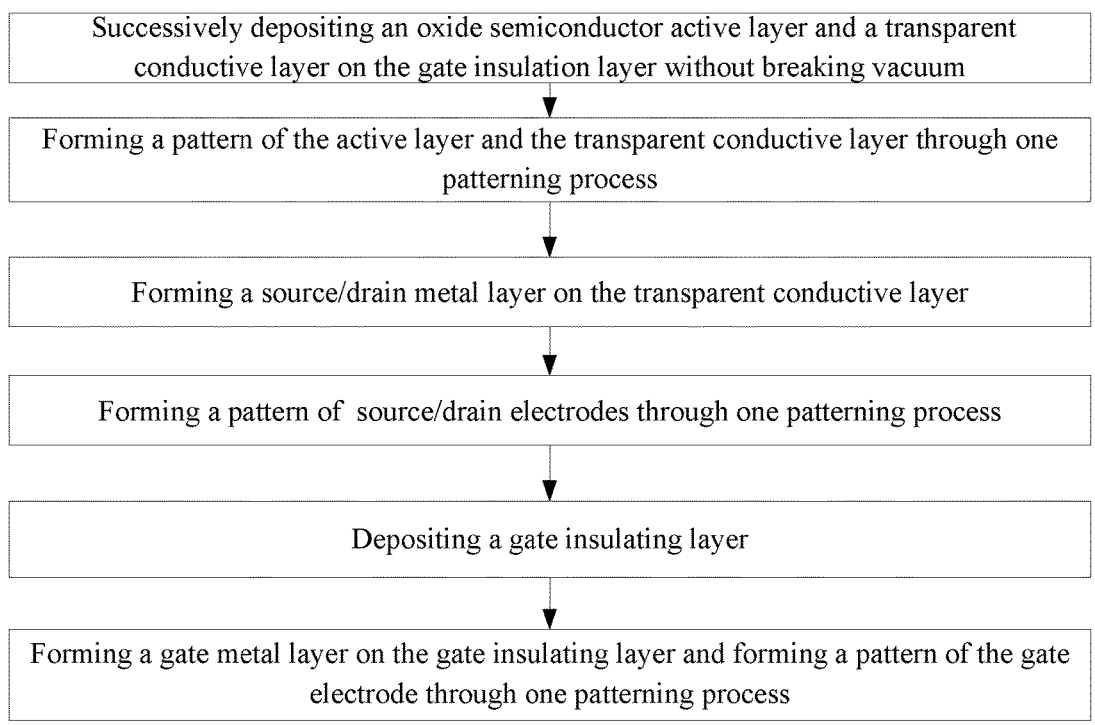
FIG. 5 is a flow chart of a method for manufacturing an oxide semiconductor TFT array substrate according to still another embodiment of the present disclosure.

In one embodiment of the present disclosure, in one example, as illustrated in FIG. 5, a method for manufacturing an oxide semiconductor TFT array substrate comprises the following operations:
 successively depositing an oxide semiconductor material layer and a transparent conductive material layer;
 forming patterns of an oxide semiconductor active layer and a transparent conductive material layer through one patterning process;
 forming a source/drain metal layer on the transparent conductive material layer;
 forming patterns of source/drain electrodes through one patterning process;
 depositing a gate insulation layer; and
 forming a gate metal layer on the gate insulation layer, and forming a pattern of gate electrode through one patterning process.

When manufacturing an oxide semiconductor TFT array substrate by the method according the embodiment of the present disclosure as described above, as the oxide semiconductor material layer and the transparent conductive material layer can also be successively deposited without breaking vacuum, it is avoided that the device robustness is degraded due to exposure of the oxide semiconductor material layer to external environment for a long time during manufacturing. Thus, the on-state current of the oxide semiconductor active layer is increased and therefore the driving voltage and power consumption of a display device utilizing the array substrate are decreased, thereby improving the device stability.

In one embodiment of the present disclosure, the finally obtained patterns of the source/drain electrodes comprise only a pattern of the drain electrode and a pattern configured to connect a data line to the drain electrode, and the portion of the transparent conductive layer in contact with the oxide semiconductor active layer is in direct electrical contact with the portion of the transparent conductive layer within the effective display area of the pixel unit. In the array substrate manufactured by the method, the pixel electrode is made of the transparent conductive layer, and is in direct contact with the oxide semiconductor. Thus, the contact resistance between the oxide semiconductor active layer and the pixel electrode are decreased and the on-state current of the oxide semiconductor active layer is increased as a result. Further, as compared with a conventional array substrate, an opaque metal layer in the source/drain electrode region are saved/removed and the aperture ratio of the pixel unit is increased, thereby the luminance of a display panel utilizing the array substrate is enhanced, and the driving voltage and power consumption of a display device utilizing the array substrate are reduced and the stability of the devices is improved.

In one embodiment of the present disclosure, in one example the pattern of the transparent conductive layer within the display area of the pixel unit has a shape of comb. When forming patterns of the oxide semiconductor active layer and the transparent conductive layer through one patterning process, the formed pattern of the transparent conductive layer for example comprises a pattern of a structure of comb which is formed by a portion of the transparent conductive layer within the display area of the pixel unit.

Figure 6:
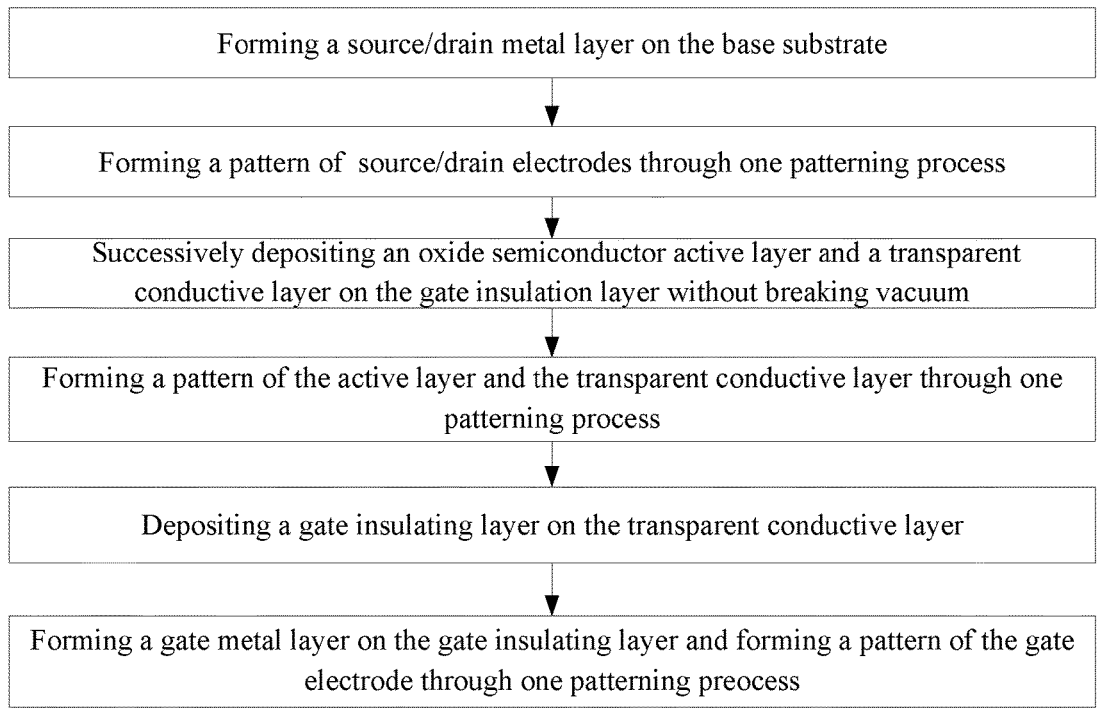
FIG. 6 is a flow chart of a method for manufacturing an oxide semiconductor TFT array substrate according to yet another embodiment of the present disclosure.

In another embodiment of the present disclosure, in one example, as illustrated in FIG. 6, a method for manufacturing an oxide semiconductor TFT array substrate comprises the following:
 forming a source/drain metal layer on a base substrate;
 forming a pattern of source/drain electrodes through one patterning process;
 successive depositing an oxide semiconductor material layer and a transparent conductive material layer without breaking vacuum;
 forming patterns of the oxide semiconductor active layer and the transparent conductive layer;
 depositing a gate insulation layer on the transparent conductive layer; and
 forming a gate metal layer on the gate insulation layer and forming a pattern of the gate electrode through one patterning process.

When manufacturing an oxide semiconductor TFT array substrate by the method according the embodiment of the present disclosure as described above, the oxide semiconductor material layer and the transparent conductive material layer can also be successively deposited without breaking vacuum, it is avoided that the device robustness is degraded due to exposure of the oxide semiconductor material layer to external environment for a long time during manufacturing. Thus, the on-state current of the oxide semiconductor active layer is increased and therefore the driving voltage and power consumption of a display device utilizing the array substrate are decreased, thereby improving the device stability.

In one embodiment of the present disclosure, the pattern of the transparent conductive layer within the display area of the pixel unit has a shape of comb for example. When forming patterns of the oxide semiconductor active layer and the transparent conductive layer through one patterning process, the formed pattern of the transparent conductive layer for example comprises a pattern of a structure of comb which is formed by a portion of the transparent conductive layer within the display area of the pixel unit.

Further, at least one embodiment of the present disclosure provides an oxide semiconductor TFT array substrate manufactured by any manufacturing method as described above. The oxide semiconductor TFT array substrate comprises a base substrate, an oxide semiconductor active layer, and a transparent conductive layer formed with a pattern of pixel electrode; here the oxide semiconductor active layer and the transparent conductive layer are successively deposited without breaking vacuum.

In the oxide semiconductor TFT array substrate, the pixel electrode is made of a transparent conductive material layer and is in direct contact with the oxide semiconductor active layer. Thus, the contact resistance between the oxide semiconductor active layer and the pixel electrode is decreased and the on-state current of the oxide semiconductor active layer is increased. Further, compared with a conventional TFT array substrate, the opaque metal layer in source/drain electrode region are saved and the aperture ratio of the pixel unit are increased, thus the luminance of a display panel utilizing such an array substrate is enhanced and therefore the driving voltage and power consumption of a display device utilizing the display panel are decreased, thereby the robustness of the products are improved.

The foregoing are merely exemplary embodiments of the disclosure, but are not used to limit the protection scope of the disclosure. The protection scope of the disclosure shall be defined by the attached claims.

The present disclosure claims priority of Chinese patent application no. 201510300713.4 filed on Jun. 3, 2015, the disclosure of which is hereby entirely incorporated by reference as a part of the present disclosure.

What is claimed is:

1. A method for manufacturing an oxide semiconductor array substrate, comprising:
    successively depositing an oxide semiconductor material layer and a transparent conductive material layer on a base substrate without breaking vacuum;
    forming a source/drain metal layer on the transparent conductive material layer; and
    forming patterns of source/drain electrodes, a transparent conductive layer, and an oxide semiconductor active layer through one patterning process, wherein forming patterns of source/drain electrodes, the transparent conductive layer, and the oxide semiconductor active layer through one patterning process comprises:
        forming a photoresist layer on the source/drain metal layer;
        exposing the photoresist layer through a half-tone mask and developing;
        removing portions of the source/drain metal layer other than a portion of the source/drain metal layer configured to form the source/drain electrodes and a portion of the source/drain metal layer within in an effective display area of a pixel unit,
        performing a first ashing process on retained photoresist layer after developing, so as to expose a region of the source/drain metal layer in a channel region to be formed;
        etching the exposed region of the source/drain metal layer in the channel region to be formed so as to form the channel region;
        partially etching a portion of the transparent conductive material layer within the channel region in a direction along a thickness of the transparent conductive material layer;
        performing a second ashing process on the retained photoresist layer so as to expose a portion of the transparent conductive material layer other than a portion of the transparent conductive material layer for a drain electrode connected with a data line;
        removing the portion of the transparent conductive material layer other than the portion of the transparent conductive material layer for the drain electrode connected with the data line; and
        removing a portion of the transparent conductive material layer retained in the channel region.

2. The method according to claim 1, wherein before successively depositing the oxide semiconductor material layer and the transparent conductive material layer on the base substrate without breaking vacuum, the method further comprising:
    forming a gate metal layer; and
    forming a pattern of a gate electrode by one other patterning process.

3. The method according to claim 1, wherein after forming patterns of an oxide semiconductor active layer and a transparent conductive layer through one patterning process, the method further comprises:
    forming a gate metal layer, and forming a pattern of gate electrode through one patterning process.

4. The oxide semiconductor array substrate according to claim 1, wherein the oxide semiconductor active layer has a reduced thickness in a channel region of the thin film transistor.

* * * * *